(12) United States Patent
Yu et al.

(10) Patent No.: US 8,008,207 B2
(45) Date of Patent: Aug. 30, 2011

(54) USE OF ION IMPLANTATION IN CHEMICAL ETCHING

(75) Inventors: Ming Lun Yu, Fremont, CA (US); Mehran Nasser-Ghodsi, Hamilton, MA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 975 days.

(21) Appl. No.: 11/752,829

(22) Filed: May 23, 2007

(65) Prior Publication Data
US 2007/0264831 A1 Nov. 15, 2007

Related U.S. Application Data

(63) Continuation-in-part of application No. 11/622,625, filed on Jan. 12, 2007, said application No. 11/752,829 and a continuation-in-part of application No. 11/622,793, filed on Jan. 12, 2007, now Pat. No. 7,945,086, and a continuation-in-part of application No. 11/622,758, filed on Jan. 12, 2007, now Pat. No. 7,709,792, and a continuation-in-part of application No. 11/622,605, filed on Jan. 12, 2007, now Pat. No. 7,879,730, and a continuation-in-part of application No. PCT/US2007/060503, filed on Jan. 12, 2007.

(60) Provisional application No. 60/758,818, filed on Jan. 12, 2006, provisional application No. 60/829,636, filed on Oct. 16, 2006, provisional application No. 60/829,643, filed on Oct. 16, 2006, provisional application No. 60/829,659, filed on Oct. 16, 2006.

(51) Int. Cl.
*H01L 21/302* (2006.01)
*H01L 21/461* (2006.01)

(52) U.S. Cl. ...................................... 438/705

(58) Field of Classification Search ................. None
See application file for complete search history.

(56) References Cited

U.S. PATENT DOCUMENTS
4,315,782 A * 2/1982 Tarng ............................ 438/310
(Continued)

FOREIGN PATENT DOCUMENTS
JP          40115539 A      4/1989
(Continued)

OTHER PUBLICATIONS

PSII, An Intorduction to Plasma Source Ion Implantation, Uniersity of Wisconsin Center for Plasma Aided Manufacturing, Oct. 30, 2005.*

(Continued)

*Primary Examiner* — Nadine G Norton
*Assistant Examiner* — Stephanie Duclair
(74) *Attorney, Agent, or Firm* — Joshua D. Isenberg; JDI Patent

(57) ABSTRACT

A method for controlling chemical dry etching to improve smoothness of an etched surface is disclosed. Ions are implanted into a surface to form a volatilizable compound at a temperature low enough to avoid, reduce, or eliminate formation of three-dimensional structures of the volatilizable compound that might create the roughness at an etched surface of the volatilizable compound. The ions are applied in a sufficient energy to penetrate to a predetermined depth of material that is to be removed from the surface in an etching cycle, and in a sufficient dosage to achieve full formation of the volatilizable compound. The surface of the volatilizable compound is exposed to a gas composition for a time duration sufficient to completely etch the volatilizable compound.

15 Claims, 6 Drawing Sheets

U.S. PATENT DOCUMENTS

| | | | |
|---|---|---|---|
| 4,622,095 A | | 11/1986 | Grobman et al. |
| 4,897,552 A | | 1/1990 | Okunuki et al. |
| 4,966,885 A | * | 10/1990 | Hebard ............................ 505/410 |
| 4,994,140 A | | 2/1991 | Kenzo et al. |
| 5,188,706 A | | 2/1993 | Hori et al. ......................... 216/12 |
| 5,346,841 A | * | 9/1994 | Yajima ............................ 438/295 |
| 5,502,306 A | | 3/1996 | Meisburger |
| 5,686,171 A | | 11/1997 | Vokoun et al. ................. 428/209 |
| 5,734,164 A | | 3/1998 | Sanford |
| 5,736,002 A | * | 4/1998 | Allen et al. ..................... 438/705 |
| 6,027,842 A | | 2/2000 | Ausschnitt et al. |
| 6,133,147 A | | 10/2000 | Rhee et al. |
| 6,593,171 B2 | | 7/2003 | Farnworth |
| 6,673,637 B2 | | 1/2004 | Wack et al. |
| 6,753,538 B2 | | 6/2004 | Musil et al. ................. 250/492.2 |
| 6,771,806 B1 | | 8/2004 | Satya et al. |
| 6,787,783 B2 | | 9/2004 | Marchman et al. |
| 6,801,596 B2 | | 10/2004 | Nasser-Ghodsi |
| 6,843,927 B2 | | 1/2005 | Nasser-Ghodsi ............... 216/84 |
| 6,943,350 B2 | | 9/2005 | Nasser-Ghodsi et al. ..... 250/310 |
| 7,148,073 B1 | | 12/2006 | Soltz et al. |
| 7,312,448 B2 | | 12/2007 | Principe |
| 7,348,556 B2 | | 3/2008 | Chitturi et al. |
| 2002/0048913 A1 | * | 4/2002 | Finney ............................ 438/524 |
| 2003/0047691 A1 | | 3/2003 | Musil et al. |
| 2004/0013858 A1 | | 1/2004 | Hacker et al. .............. 428/195.1 |
| 2004/0033425 A1 | | 2/2004 | Koops et al. |
| 2004/0041095 A1 | | 3/2004 | Nasser-Ghodsi et al. |
| 2004/0266200 A1 | | 12/2004 | Schaller et al. ............... 438/705 |
| 2005/0048751 A1 | | 3/2005 | Moore |
| 2006/0000802 A1 | | 1/2006 | Kumar et al. ................... 216/67 |
| 2007/0069759 A1 | | 3/2007 | Rzepiela et al. |
| 2007/0158303 A1 | | 7/2007 | Nasser-Ghodsi et al. ......... 430/5 |
| 2007/0158304 A1 | | 7/2007 | Nasser-Ghodsi et al. ....... 216/66 |
| 2007/0158562 A1 | | 7/2007 | Nasser-Ghodsi et al. ..... 250/310 |
| 2008/0088831 A1 | | 4/2008 | Mulders et al. |

FOREIGN PATENT DOCUMENTS

WO     WO2007/100933     7/2007

OTHER PUBLICATIONS

U.S. Appl. No. 60/758,818 entitled "Tungsten Plug Deposition Quality Evaluation Method by Ebace Tecnology" to Yehiel Gotkis, filed Jan. 12, 2006.

U.S. Appl. No. 60/829,636 entitled "Etch Selectivity Enhancement in Electron Beam Activated Chemical Etch" to Nasser-Ghodsi; Mehran; et al., filed Oct. 16, 2006.

U.S. Appl. No. 60/829,643 entitled "Structural Modification Using Electron Beam Activated Chemical Etch" to Nasser-Ghodsi; Mehran; et al., filed Oct. 16, 2006.

U.S. Appl. No. 60/829,659 entitled "Three-Dimensional Imagine Using Electron Beam Activated Chemical Etch" to Nasser-Ghodsi; Mehran; et al., filed Oct. 16, 2006.

U.S. Appl. No. 11/622,793 entitled "Tungsten Plug Deposition Quality Evaluation Method by Ebace Technology" to Yehiel Gotkis, filed Jan. 12, 2007.

International Search Report and Written Opinion for International Application No. PCT/US07/60503.

A. Jain et al., "Thin Solid Film" vol. 269, pp. 51-56, 1995.

Office Action dated Feb. 19, 2009 for U.S. Appl. No. 11/622,758.

Office Action dated Jun. 10, 2010 issued for U.S. Appl. No. 11/622,625.

Matsui et al., Electron Beam induced Selective Etching and Deposition Technology, 1989, Journal of Vacuum Science and Technology, Sep. / Oct. 1989, B7, vol. 5, pp. 1182-1190.

Wang et al., Etching Characteristics to Chromium Thin Films by an Electron Beam Induced Surface Reaction, 2003, Semiconductor Science and Technology, vol. 18, pp. 199-205.

Final Office Action dated Jun. 4, 2010 issued for U.S. Appl. No. 11/622,605.

Non-Final Office Action dated Mar. 29, 2010 for U.S. Appl. No. 11/622,793.

Office Action dated Dec. 7, 2009 for U.S. Appl. No. 11/622,625.

Office Action dated Dec. 24, 2009 for U.S. Appl. No. 11/622,605.

Notice of Allowance and Fee(s) dated Dec. 17, 2009 for U.S. Appl. No. 11/622,758.

Asakawa et al. Chlorine Based Dry Etching og III/V Compound Semiconductors for Optoelectronics Application, Nov. 18, 1997, Japanese Journal of Applied Physics, vol. 37, pp. 373-387.

Kowalksi, Ion Bombardment modification of surface morphology of Solids, 1994, Journal of Materials Science, vol. 29, pp. 3542-3552.

Jain et al., Thermal Dry-Etching of Copper Using Hydrogen peroxide and Hexafluroacetylacetone, Thin Solid Films 269 (1995) pp. 51-56.

Definition of word "embed"—Definition and More from the Free Merriam-Webster Dictionary—download from link http://www.merriam-webster.com/dictionary/embed on Mar. 18, 2010, 2 pages.

"central processing unit" Encyclopedia Britannica, 2009. Encyclopedia Britannica Online, Aug. 10, 2009 <http://www.search.eb.com/eb/article-9022087>.

Final Office Action dated Aug. 14, 2009 for U.S. Appl. No. 11/622,758.

Final Office Action dated Jul. 1, 2010 issued for U.S. Appl. No. 11/622,793.

Office Action dated Sep. 13, 2010 issued for U.S. Appl. No. 11/622,793.

Notice of Allowance and Fees Due dated Sep. 17, 2010 issued for U.S. Appl. No. 11/622,605.

Office Action dated Dec. 3, 2010 issued for U.S. Appl. No. 11/622,625.

Toyoda et al., Ultra Smooth Surface Preparation using Gas Cluster Ion Beams, 2002, Japanese Journal of Applied Physics, vol. 41, pp. 4287-4290.

Final Office Action dated May 20, 2011 issued for U.S. Appl. No. 11/622,625, filed Jan. 12, 2007.

* cited by examiner

USE OF ION IMPLANTATION IN CHEMICAL ETCHING

CROSS REFERENCE TO RELATED APPLICATION

This application is a continuation-in-part of and claims the benefit of priority of U.S. patent application Ser. No. 11/622,625, which was filed on Jan. 12, 2007, the entire disclosure of which are incorporated herein by reference. U.S. patent application Ser. No. 11/622,625 claims the benefit of priority to U.S. Provisional Patent Application Nos. 60/758,818, filed Jan. 12, 2006, 60/829,636, 60/829,643, 60/829,659 filed Oct. 16, 2006. This application claims the benefit of priority of provisional applications 60/758,818, 60/829,636, 60/829,643, 60/829,659, the disclosures of all of which are incorporated herein by reference.

This application is also continuation-in-part of and claims the benefit of priority of U.S. patent application Ser. Nos. 11/622,605 now U.S. Pat. No. 7,879,730, 11/622,758, now U.S. Pat. No. 7,709,792, 11/622,793 now U.S. Pat. No. 7,945,086, and International Application PCT/US2007/060503, all filed Jan. 12, 2007 the disclosures of all of which are incorporated herein by reference.

GOVERNMENT INTERESTS

This invention was made with Government support during an effort supported by Government Technology Investment agreement number W911NF-04-3-0001, awarded by the U.S. Army Research Laboratory (ARL). The Government has certain rights in the invention.

FIELD OF THE INVENTION

This invention generally relates to semiconductor fabrication and more particularly to ion implantation in the chemical etching of copper.

BACKGROUND OF THE INVENTION

Recent technical advances have indicated that it is desirable to form metallized microelectronic components and interconnects from copper rather than the more traditional aluminum. Copper metallization structures are preferred to the more conventional aluminum structures because the resistivity of copper is significantly lower than that of aluminum. Consequently copper metal components can be made smaller than aluminum components and will require less energy to pass electricity through them, which leads to better processor performance.

Chemical dry etching of copper can be done by a two step chemical reaction. First, copper is oxidized to form copper oxide. Next, the copper oxide is etched away by reacting with hexafluoroacetylacetone (hfacH) gas to form a volatile product. This two step chemical reaction is described, e.g., by A. Jain, T. T. Kodas, and M. J. Hampden-Smith, in Thin Solid Films Vol. 269, pp 51-56, 1995, which is incorporated herein by reference.

First step: $Cu+O_2 \rightarrow Cu_2O, CuO$

Second step:
Cuprous oxide: $Cu_2O+2hfacH \rightarrow Cu(hfac)_2+Cu+H_2O$
Cupric oxide: $CuO+2hfacH \rightarrow Cu(hfac)_2+H_2O$ Oxidation of copper is usually done by exposing the copper to oxygen gas or species from an oxygen plasma at elevated temperature, e.g., about 150° C.-300° C. At these temperatures, three-dimensional oxide structures are formed, which are determined by the thermodynamics of the oxidation reaction. The three-dimensional structures cause the copper oxide layer to be non-uniform. The morphology of the etched copper surface is determined by the morphology of the oxide/copper metal interface, which is roughened by the formation of these three-dimensional structures.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
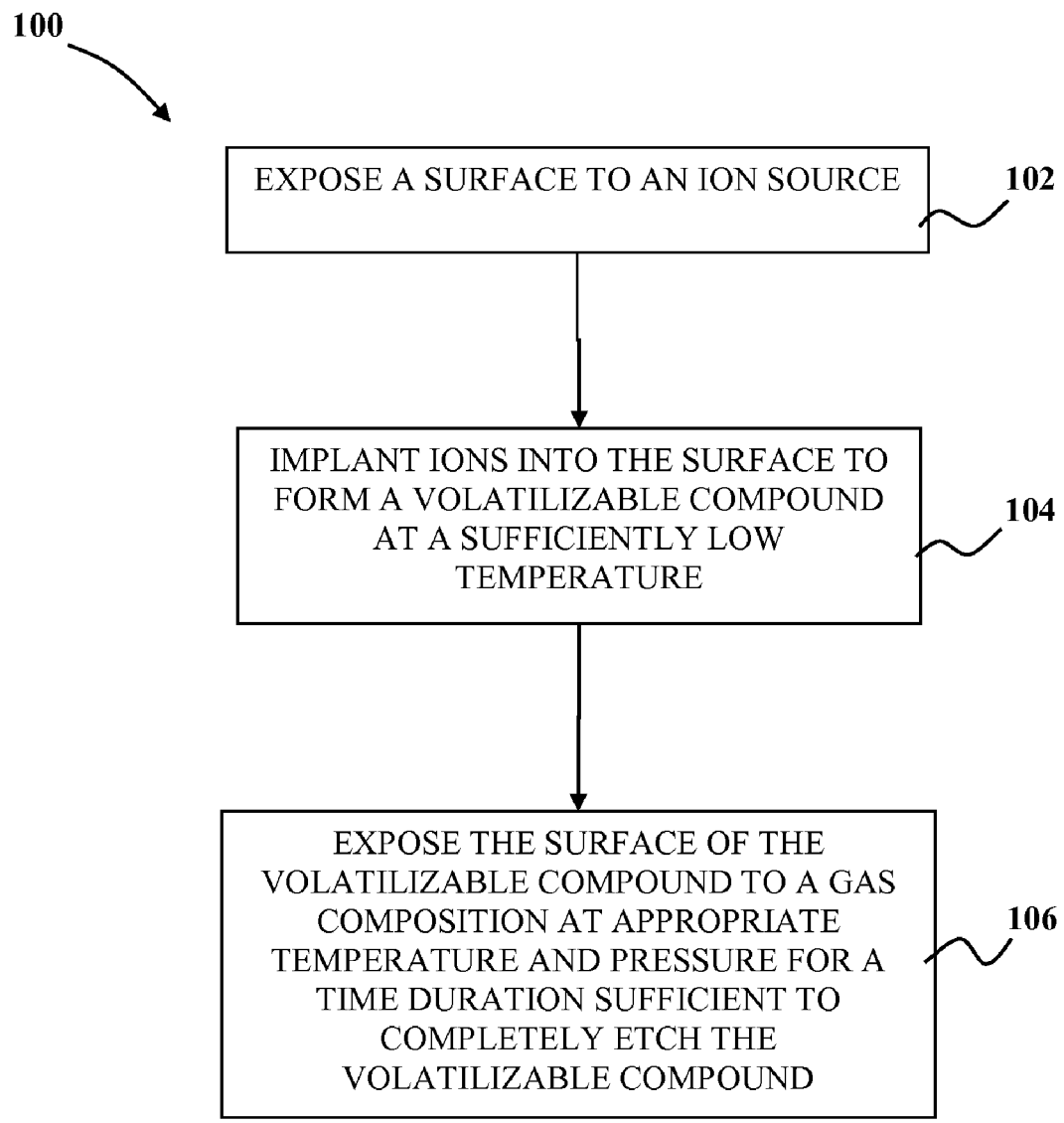
FIG. 1A is a flow diagram illustrating an example of a method for controlling chemical dry etching to improve smoothness of an etched surface according to a preferred embodiment of the present invention.

FIG. 1A illustrates a method 100 for controlling chemical dry etching to improve smoothness of an etched surface according to a preferred embodiment of the present invention. At 102, a surface of a non-volatilizable material is exposed to an ion source. Exposing the non-volatilizable material to the ion source may involve exposure of all or nearly all of the surfaces to the ions. Alternatively only selected portions of the surface may be exposed to the ions. For example, a mask or patterned resist may cover certain portions of the surface while exposing other portions. The exposed portions may then be exposed to the ions from a wide area source, such as a plasma. Alternatively, selected portions of the surface may exposed to the ions without the use of a mask. For example, the surface may be exposed to a focused beam ion source. The beam may be electrostatically and/or electromagnetically deflected to vary the position of the intersection between the ion beam and the surface. Alternatively, the surface may move relative to the ion source or vice versa. By selectively turning the beam on and off certain portions of the surface may be exposed to the ions while other portions are not.

The ions are selected according to the desired chemistry of a volatilizable compound to be formed as a result of the ion implantation into the non-volatilizable material. As used herein, a non-volatilizable material is one that does not readily form volatile products in a single step chemical reaction. As used herein, a volatilizable compound is one that can form volatile products upon reaction with an appropriate reagent. Examples of suitable ions that may be used to form volatilizable compounds from non-volatilizable materials include chlorine ions, fluorine ions, bromine ions, iodine ions or oxygen ions. By way of example, copper may be regarded as a non-volatilizable material and the selected ions may be oxygen ions, i.e., $O^+$ or $O_2^+$ for the formation of volatilizable copper oxide, or fluorine ions, i.e., $F^+$ or $F^-$, for the formation of volatilizable copper fluoride.

At 104, the ions are implanted on the surface to form the volatilizable compound at a temperature low enough to avoid the thermodynamic of thermal reaction to avoid, reduce or eliminate the formation of three-dimensional structures of the volatilizable compound that might create the roughness at the etched surface of the volatilizable compound as described above. By way of example, the ion implantation may be performed with the wafer at a sufficiently low temperature so that the growth of 3-dimensional oxide structures is insignificant. For example, the wafer temperature may be at or below room temperature.

The depth to which the volatilizable compound is formed depends on the depth to which the ions are implanted into the non-volatilizable material. The averaged implantation depth is defined as the range of the ion, and is determined by the ion energy and ions' incidence angle. The ion penetration depth is typically largest at normal incidence (90 degree with respect to the plane of the surface) and is smaller at non-normal incidence, e.g., using 15 degree with respect to the plane of the surface for glancing-angle incidence. The usable incident angle may range between these two limits, depending on specific applications.

Figure 1B:
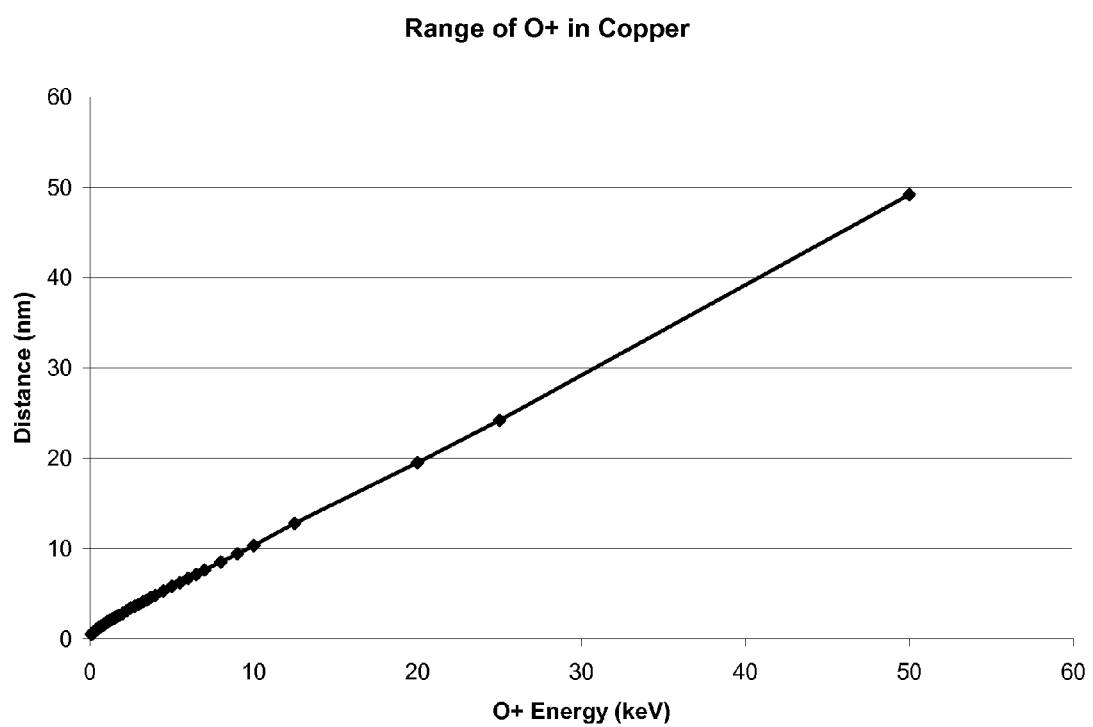
FIG. 1B is a plot of implantation depth vs. ion energy for implantation of oxygen ions into a copper surface for copper oxidation.

Silicon oxide formation by oxygen ion implantation is also the basis of the separation by implantation of oxygen (SI-MOX) process for silicon-on-insulation (SOI) wafer fabrication. The density and range of the oxygen ion are primarily determined by the ion implantation conditions. A compilation of the average range and straggling of $O^+$ in copper as a function of ion energy may be determined by a Stopping and Range of Ion in Matter (SRIM) simulation. As an example, FIG. 1B is a plot of implantation depth from the simulation vs. ion energy when oxygen ions are implanted into the copper surface for copper oxidation at normal incidence. The corresponding results for $O_2^+$ for a particular energy may be estimated from the $O^+$ values at double the ion energy. As shown in FIG. 1B, the range can be limited to less than 2 nm if the ion implantation energy is kept below about 1 keV. In practice, the copper layer may gradually convert to copper oxide during the implantation. In addition, there may be sputtering of the surface of the copper layer during the ion implantation. The range of the ion implantation may vary due to these factors.

In this example, copper etching may proceed by two mechanisms. The first mechanism involves the sputtering of the copper surface atoms by the oxygen ions during ion implantation. The second mechanism is the removal of the oxidized copper by the hfacH reaction. Qualitatively, higher ion energy increases the range of the ions. Therefore the thickness of copper that is finally removed increases with increasing ion energy. For example, at normal incidence, about 4 nm of copper may be removed with 300 eV $O_2^+$ ion implantation while over 50 nm of copper may be removed with 25 kV of $O_2^+$ ion implantation. Deeper copper etch can be achieved by repeating the ion implantation/etching cycle.

Ideally, the ions are applied in a sufficient dosage to achieve full formation of the volatilizable compound in this copper layer. For example, one often wants to oxidize copper all the way to cupric oxide (CuO), for which the hfacH etching process is 100% efficient. However, the depth of penetration of the ions at a particular energy has a distribution due to the scattering of the ions by the atoms in the solid. Such scattering often changes the direction of an ion's trajectory, producing a phenomenon called ion straggling. By using a higher ion dose, it is possible to push the formation of CuO to a larger depth. The depth of oxide formation, and therefore the thickness of copper etched, may therefore be controlled by the ion dose. For example, experiments have shown that with 25 kV of $O_2^+$, about 25 nm of copper can be etched with $5.5 \times 10^{16}/cm^2$ of dose while about 56 nm of copper can be removed with $1.1 \times 10^{17}/cm^2$ of total dose.

Therefore, both ion energy and ion dose may be used to control the depth of copper etching. The optimum condition will probably be determined empirically with other considerations such as the surface roughness of the etched surface.

Empirically, it was found that the combination of oxygen ion implantation and the hfacH removal of the oxide contributed about a few nm to the surface roughness. Qualitative, the roughness tends to increase with the ion energy. There can be several possible causes of the increase in the surface roughness. One factor is ion straggling. Ion straggling may introduce nonuniformity in oxidation due to statistical fluctuations. A second factor is the swelling of the material during ion implantation. The build up of stress due to the swelling may present non-uniformity, and hence may roughen the surface. A third possible factor is ion sputtering which is known to cause surface roughness. In experiments, structures ~50 nm deep have been formed in copper with ~5 nm root mean square (rms) bottom uniformity using a combined oxygen ion implantation and hfacH etching technique. Experiments were performed using $O_2^+$ ions with an ion energy of about 25 keV and an ion dose of about $10^{17}$ ions/cm$^2$. Only one etching cycle was used. This increase in surface roughness may be address by glancing incidence.

Each copper etching cycle may comprise an ion implantation step followed by hfacH etching of the volatilizable compound. To increase the rate of copper etching per etch cycle, one may use high ion implantation energy even up to 100 keV as in the SIMOX (separation by implantation of oxygen) process, and high ion doses. To overcome the increased surface roughness after these processes, one may use a low energy glancing angle ion implantation followed by hfacH etching of the oxide to improve the surface smoothness.

Figure 3A:
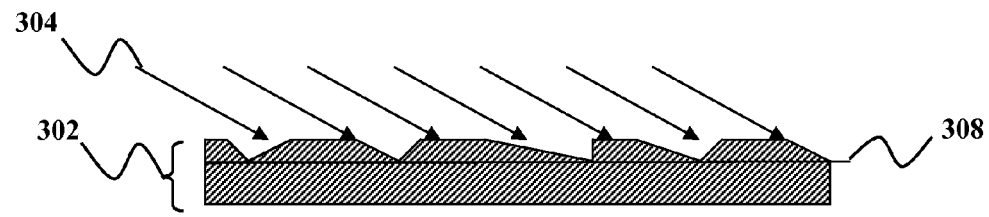
FIGS. 3A-3D are cross-sectional schematic diagrams illustrating an additional method for controlling chemical dry etching to improve smoothness of an etched surface described in FIG. 1.
Figure 3B:
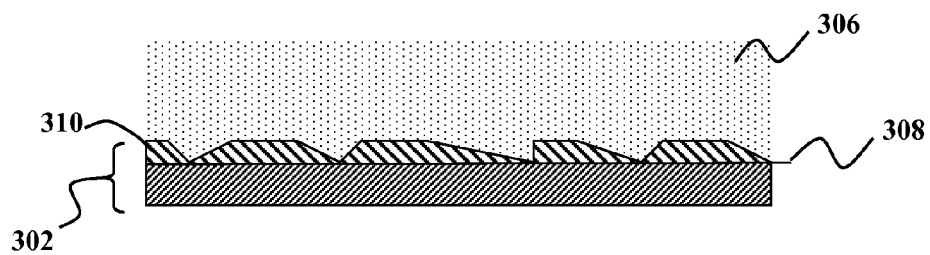
Figure 3C:
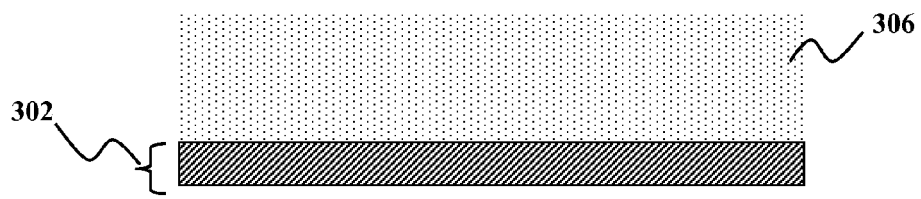
Figure 3D:
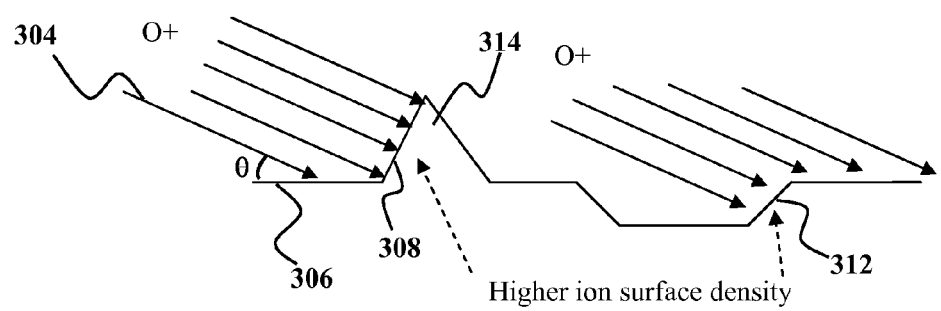

FIG. 3D is a cross-sectional schematic diagram illustrates an example of using glancing incidence to implant the ions into a copper surface. As shown in FIG. 3D the oxygen ions 304 are implanted at asperities 312 and 314 of a copper surface 306 at an angle A. The ion surface density is higher at the asperities surfaces 312 and 314 than other areas of the surface 306. As a result, copper could be removed more readily at those locations in the hfacH etching process, which improves the smoothness of etched surface 306. The glancing-angle θ could be adjusted between 15° and 45° during the ion implantation to optimize the smoothness of the etched surface. The ion energy is preferably sufficiently low so that oxidization mostly takes place at the asperities on the surface. This may also minimize oxidation below the mask and therefore minimize undercutting during etching.

To optimize the uniformity of the ion implantation, the copper surface 306 is rotated in a horizontal plane while the ions 304 are implanted into the surface of the surface 306 so that the ions are implanted from all sides. The idea is similar to the use of glancing ion beam for surface smoothing such as that in "Zalar" rotation during sputtering for depth profiling. The dose of ions per unit area may be kept as uniform as possible by using a more complex motion e.g., planetary motion that is commonly used in thin film deposition. Such planetary motion may involve both rotation about a wafer axis and orbital motion about another axis.

The volatilizable compound formed as a result of ion implantation is then exposed to a gas composition at appropriate temperature and pressure for a time duration sufficient to completely etch the volatilizable compound as indicated in 106. As described above, hexafluoroacetylacetone (hfacH) may be used for etching copper oxide at a temperature of about 250° C. and a pressure of about 1 Torr for about 2 minutes. Alternatively, the gas composition could contain one or more gaseous components that etch the volatilizable compound upon activation by interaction with a beam of electrons. In this situation, a beam of electrons is directed toward the volatilizable compound in the vicinity of the etching gas composition. An interaction between the electron beam and the gas composition etches the volatilizable compound exposed to both the gas composition and the electron beam. This technique is so called Electron Beam Activated Chemical Etch (eBACE), which is described in prior commonly-assigned U.S. patent application Ser. No. 11/622,625 which was incorporated by reference.

The method 100 as described in FIG. 1A, which includes the ion implantation and gas composition etching cycle, may be repeated until a desired thickness of the material has been removed from the surface. Since ion implantation is preferably done at low temperatures while the etching reaction typically happens at elevated temperature, the temperature cycling time may become a bottleneck for the net etch rate. One possible scheme to address this bottleneck is to use active cooling of the wafer to maintain a low temperature for the implantation, and to use high power flash lamp to heat the top surface of the copper rapidly for the etching reaction. Since only the very top surface of the wafer is heated in the transient, it may rapidly cool back to low temperatures with the active cooling. The actual cycle time and net etch rate will depend on the individual apparatus.

Figure 2A:
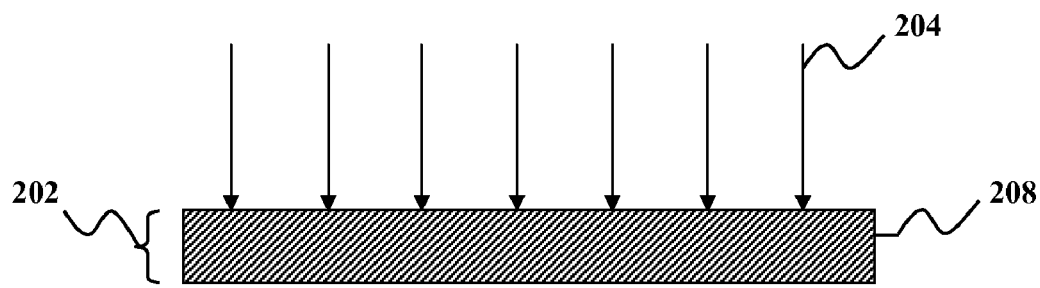
FIGS. 2A-2C are cross-sectional schematic diagrams illustrating a method for controlling chemical dry etching to improve smoothness of an etched surface described in FIG. 1.
Figure 2B:
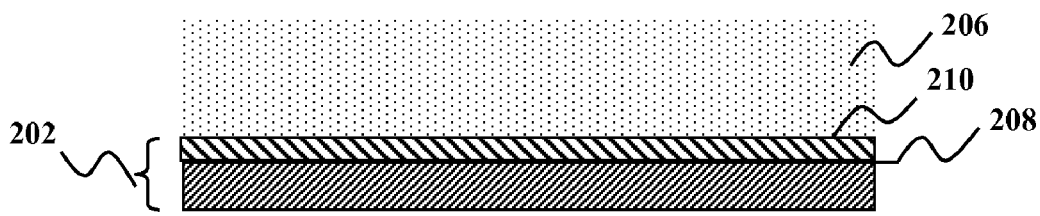
Figure 2C:
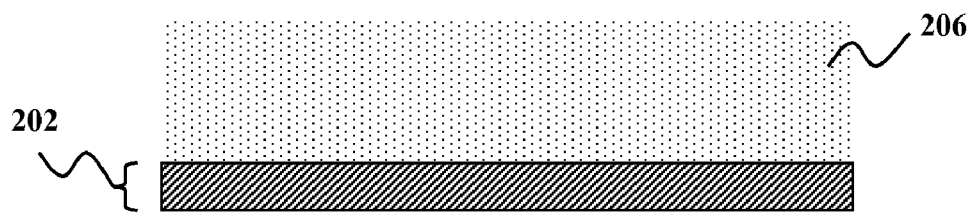

FIGS. 2A-2C are cross-sectional schematic diagram illustrating the method for controlling chemical dry etching to improve smoothness of an etched surface as described in FIG. 1A. As illustrated in FIG. 2A, a target 202 is exposed to source of ions 204. The ions 204 are implanted into the surface of target 202 at a normal incidence and at a temperature low enough to avoid the thermodynamic of thermal reaction to form a volatilizable compound. The ion source could be a plasma or an ion beam optical column. The ions 204 are implanted with sufficient energy to penetrate to a substantial depth at chosen level 208 and in a sufficient dosage to achieve full formation of a volatilizable compound 210. The target 202 may be rotated in a horizontal plane while the ions 204 are implanted into the surface of the target 202 so that the ions are implanted from all azimuths. The oxygen ion dose per unit area may be kept as uniform as possible to optimize the uniformity of the volatilizable compound 210.

As shown in FIG. 2B, the volatilizable compound 210 of the target 202 are exposed to a gas composition 206 at appropriate temperature and pressure for a time duration sufficient to completely etch the volatilizable compound 210. In certain applications, the target 202 may also be exposed to electrons to facilitate etching. FIG. 2C shows a target 202 after the volatilizable compound 210 being removed.

FIGS. 3A-3C are cross-sectional schematic diagrams illustrating an alternative method for controlling chemical dry etching to improve smoothness of an etched surface described in FIG. 3D. The method described in FIGS. 3A-3C is similar with the method described in FIGS. 2A-2C excepting that the ions 304 are implanted into a rough surface of a target 302 at a glancing-angle incidence. As shown in FIG. 3A, the ions 304 are applied with a sufficient energy and suitable incident angle to straggle to a substantial depth at chosen level 308 and in a sufficient dosage to achieve full formation of a volatilizable compound 310. As shown in FIG. 3B, the volatilizable compound 310 of the target 302 are exposed to a gas composition 306 at appropriate temperature and pressure for a time duration sufficient to completely etch the volatilizable compound 310. In certain applications, the target 302 may also be exposed to electrons to facilitate etching. FIG. 3C shows the target 302 after the volatilizable compound 310 has been removed.

Using glancing-angle ion bombardment for surface modification rather than conventional near-normal incidence ions has the advantages of preferentially removing surface asperities leading to flat surfaces.

Figure 4:
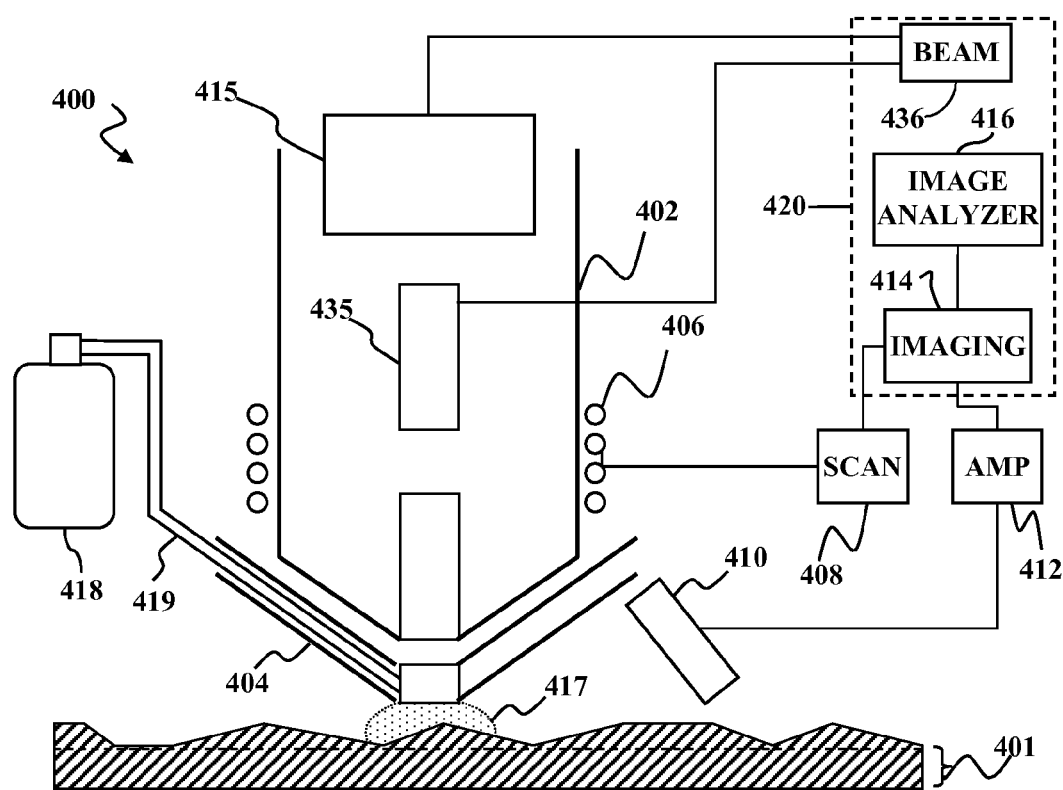
FIG. 4 is a block diagram of an electron beam activated chemical etch (eBACE) system according to an embodiment of the present invention.

FIG. 4 is a block diagram of an electron beam activated chemical etch (eBACE) system 400 adapted for use with embodiments of the present invention. As shown in FIG. 4, the system 400 generally includes an electron beam column 402 with an electron source 415, beam optics 435 an immersion lens 404. The electron beam column may be part of a scanning electron microscope having a controller 420. The controller 420 may include an image generator 414, image analyzer 416 and electronics 436, referred to herein as an e-beam driver that controls the electron beam column 402. The e-beam driver 436 may control the electron source 415, beam optics 435 and immersion lens 404.

Electrons from the electron beam column 402 are focused onto a target surface 401. The electrons are scanned across the surface of the target 401 by magnet deflecting fields provided by one or more scanning coils 406. Current is provided to the coils 406 via a scanner driver 408. Electrons striking the target 401 are either backscattered or initiate secondary emission. Either way a detector 410 generates a signal proportional to the amount of backscattering or secondary emission. The signal may be amplified by an amplifier 412. The amplified signal and a signal from the scanner driver 408 are combined by the image generator 414 to produce a high-contrast, magnified image of the surface of the target 401. The images may be analyzed by the image analyzer 416.

An electron activated etching gas or vapor composition 417 is introduced from one or more remote sources 418 via a conduit 419. It is desirable to introduce the etching gas or vapor as close as possible to the point on the surface of the target 401 impacted by the electrons from the electron beam column 402. By way of example, the etching gas or vapor may be introduced between two adjacent electrodes of the immersion lens 404. The electrons activate localized etching of the target surface 401. Images of the etched surface generated by the image generator may be analyzed by the image analyzer 416. The image analysis determines a measure of quality of the modified surface or shape and size of resulting formed structures. More details on the ion implantation for patterned etching of materials using the EBACE system described above can be found in prior commonly-assigned U.S. patent application Ser. No. 11/622,625, which has been incorporated herein by reference.

Figure 5A:
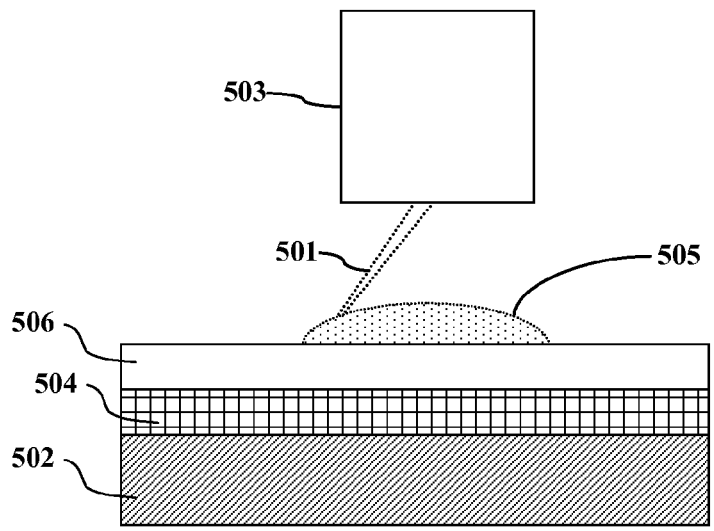
FIGS. 5A-5D are schematic cross sectional views illustrating method for etching copper patterns using eBACE method combined with oxygen ion beams according to another alternative embodiment of the present invention.
Figure 5B:
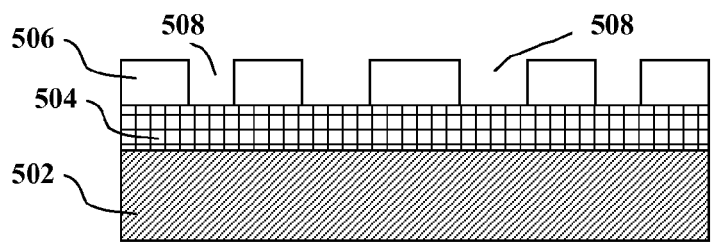
Figure 5C:
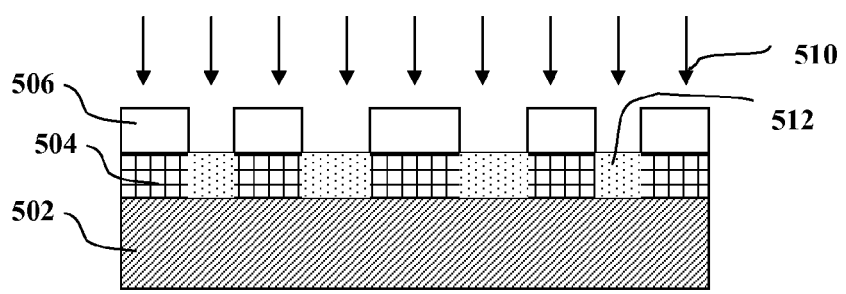

In an embodiment of the present invention the eBACE method may be combined with selective ion implantation for patterned etching of materials that are otherwise difficult to etch. The ion implantation may be performed either with or without using a mask. For example, as shown in FIG. 5A a wafer 502 may be covered by a copper layer 504 with an insulator layer 506 on the top. The insulator layer 506 can be etched by means of interaction of electron beam 501 from a beam column 503 with gas composition 505 to form openings 508 in the insulator layer 506 using eBACE as shown in FIG. 5B. The openings expose portions of the copper layer 504. Alternatively, the mask pattern may be formed using conventional photolithographic techniques. Exposed portions of the copper layer 504 are subjected to bombardment by energetic ions 510 to create volumes 512 of volatilizable material beneath the openings as illustrated in FIG. 5C. The wafer 502, copper layer 504 and insulator layer 506 may be kept at relatively low temperature (e.g., room temperature) during ion implantation, e.g., by actively or passively cooling the wafer 502.

By way of example, the energetic ions 510 may be oxygen ions. Implanting sufficient doses of oxygen ions into the copper layer 504 can form volumes 512 of volatilizable copper oxide. Where a mask is used, the ion bombardment may take place over a wide area. In alternative embodiments, ions may be implanted at selected locations without using a mask. For example, a focused ion beam system may be used to directly "write" a pattern of ion implantation at selected locations on the copper layer 504. Furthermore, embodiments of the invention may be implemented using combinations of ion bombardment through a mask and direct write (e.g., focused beam) ion implantation. Alternatively, ions may be implanted using an ion diffusion top layer deposition tool. The depth of ion implantation may be controlled, e.g., by control of the ion energy. Oxygen implantation depths for energies between about 20-50 kV have been reported for implantation of oxygen ions into copper to depths of about 20 nm to about 50 nm.

Figure 5D:
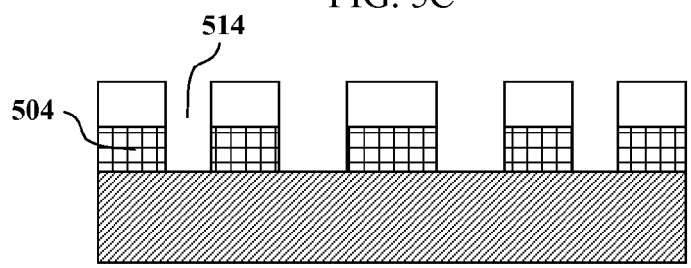

The copper oxide volumes 512 may be etched using eBACE method to form a desired pattern on a wafer shown on FIG. 5D leaving openings 514 in the copper layer 504. By way of example, and without limitation, a gas composition used to etch copper oxide volumes 512 may include a halogen-based etching compound, e.g., HCl, $Cl_2$ etc. The electron beam may be provided by a wide area "flood" gun, e.g., a 300-mm electron flood gun.

Embodiments of the present invention may replace chemical-mechanical polishing (CMP) of copper or other materials in semiconductor wafer or chip manufacturing.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for controlling chemical dry etching to improve smoothness of an etched surface, comprising:
   a) implanting ions into a surface to form a volatilizable compound at a temperature low enough to avoid, reduce, or eliminate formation of three-dimensional structures of the volatilizable compound that might create the roughness at an etched surface of the volatilizable compound, wherein the ions are applied in a sufficient energy to penetrate to a predetermined depth of material that is to be removed from the surface in an etching cycle, and in a sufficient dosage to achieve full formation of the volatilizable compound;
   b) exposing the surface of the volatilizable compound to a gas composition for a time duration sufficient to completely etch the volatilizable compound; and
   c) rotating the surface while implanting the ions into the surface to form the volatilizable compound, wherein rotating the surface includes imparting planetary motion to the surface;
   wherein the ions are implanted at a glancing-angle of incidence of about 15° to 45° relative to a plane of the surface.

2. The method of claim 1, wherein the glancing-angle of incidence is adjusted during the ion implantation to optimize a smoothness of the etched surface.

3. The method of claim 1, wherein the ions are implanted at room temperature.

4. The method of claim 1, wherein the ions are selected from the group consisting of fluorine ions, chlorine ions, iodine ions and bromine ions.

5. The method of claim 1 wherein the ions comprises oxygen ions.

6. The method of claim 5, wherein the surface includes copper.

7. The method of claim 6, wherein the ion implantation energy is less than about 1 KeV.

8. The method of claim 6 wherein the gas composition comprises hexafluoroacetylacetone.

9. The method of claim 1, further comprising controlling a depth of implantation of the ions by adjusting an energy of the ions.

10. The method of claim 1, further comprising controlling a depth of implantation of the ions by adjusting a dose of the ions.

11. The method of claim 1 wherein the gas composition contains one or more gaseous components that etch the volatilizable compound upon activation by exposure to electrons.

12. The method of claim 11 further comprising directing a beam of electrons to the surface of the volatilizable compound that are exposed to the gas composition to etch the volatilizable compound.

13. The method of claim 1, further comprising, repeating a) and b) until a desired thickness of material has been removed from the surface.

14. The method of claim 1, further comprising actively cooling the surface during a).

15. The method of claim 1, further comprising heating the surface just prior to or during b).

* * * * *